(12) United States Patent
Mone

(10) Patent No.: US 7,106,140 B2
(45) Date of Patent: Sep. 12, 2006

(54) CALIBRATABLE PHASE-LOCKED LOOP

(75) Inventor: Patrick Mone, Valbonne (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/515,690

(22) PCT Filed: May 20, 2003

(86) PCT No.: PCT/IB03/02157

§ 371 (c)(1),
(2), (4) Date: Nov. 24, 2004

(87) PCT Pub. No.: WO03/100979

PCT Pub. Date: Dec. 4, 2003

(65) Prior Publication Data

US 2005/0174180 A1  Aug. 11, 2005

(30) Foreign Application Priority Data

May 28, 2002  (FR) ................................. 02 06503

(51) Int. Cl.
*H03L 7/00* (2006.01)

(52) U.S. Cl. .................... 331/16; 331/1 A; 331/177 R; 331/34; 331/175

(58) Field of Classification Search ................. 331/16, 331/175, 1 A, 177 R, 34
See application file for complete search history.

(56) References Cited

U.S. PATENT DOCUMENTS 5,382,922 A     1/1995  Gersbach et al. ........... 331/1 A
6,686,804 B1 *  2/2004  Adams et al. ................ 331/17

* cited by examiner

*Primary Examiner*—Arnold Kinkead
(74) *Attorney, Agent, or Firm*—Adam L. Stroud

(57) ABSTRACT

The subject matter hereof relates to a calibratable phase-locked loop. The calibratable phase-looked loop in an example embodiment comprises a charge pump and calibration means for the loop, wherein calibration means comprises: first means for rendering unstable a stable phase-locked loop so that a sinusoidal signal is provided; second means for generating a squared signal from the so-provided sinusoidal signal; and a logic circuit for determining the frequency of the squared signal and for controlling the charge pump in correcting the frequency of the squared signal as a function of a desired frequency.

20 Claims, 5 Drawing Sheets

CALIBRATABLE PHASE-LOCKED LOOP

The present invention relates to an integrated circuit comprising a phase-locked loop, a charge pump and calibration means. The invention also relates to a method of calibrating such a loop.

The invention finds a particular application notably in mobile telephones as regards their receiving part.

A receiver of a mobile telephone comprises an integrated circuit which operates with an internal clock. This clock is generated by the phase-locked loop currently called PLL, which loop is located in the integrated circuit. A phase-locked loop is generally manufactured with analog circuits for reasons of limitations of size, speed and energy consumption. The phase-locked loop has a transfer function which depends on characteristic features of the analog components used for manufacturing such a loop. Such components are, for example, a voltage-controlled oscillator, capacitors, a current pump, a phase comparator. The transfer function may thus vary because of variations of parameters inherent in these various components, which is annoying for the performance of said loop. Actually, parameters which belong to the loop such as stability, settling time and the bandwidth of the transfer function of noise directly depend on the transfer function of the PLL.

U.S. Pat. No. 5,382,922 entitled "Calibration systems and methods for settling PLL Gain characteristics and Center Frequency" and filed Dec. 23, 1993, by IBM, describes an analog calibration system which permits to calibrate a voltage-controlled oscillator, notably its center frequency and its gain with the same circuit.

Although this state-of-the-art technique permits to slightly improve the performance of the PLL, it does not permit to obtain an optimal transfer function. Actually, this state of the art permits to calibrate only a single component of the PLL, the voltage-controlled oscillator, from a lot of other components and, consequently, only a single parameter of the transfer function of the PLL from a lot of other parameters. The transfer function may always vary because of other parameters and in an uncontrolled way.

Consequently, a technical problem to be resolved by an object of the present invention is to propose an integrated circuit that comprises a phase-locked loop, a charge pump and calibration means, as well as a calibration method for such a loop, which permit to obtain optimal performance for the transfer function corresponding to said loop and this without utilizing too complex a system.

A solution to the technical problem posed is characterized according to the first object of the present invention in that the calibration means comprise:
  first means for rendering the phase-locked loop unstable so that it supplies a sinusoidal signal;
  second means for generating a squared signal from the sinusoidal signal; and
  a logic circuit for:
    determining the frequency of the squared signal;
    comparing said frequency with a desired frequency; and
    controlling the charge pump with a view to correcting the frequency of the squared signal as a function of the desired frequency.

According to a second object of the present invention this solution is characterized in that the calibration method for the loop comprises the stages of:
  rendering the phase-locked loop unstable so that it produces a sinusoidal signal;
  generating a squared signal from the sinusoidal signal;
  determining the frequency of the squared signal;
  comparing said frequency with a desired frequency; and
  controlling the charge pump with a view to correcting the frequency of the squared signal as a function of the desired frequency.

Thus, as will be seen in more detail below, the calibration means permit to modify the frequency of the oscillations of the phase-locked loop according to a desired frequency so that the loop has a substantially constant transfer function. This is obtained by means of a simple system that does not intervene directly in the set of components of the phase-locked loop.

Advantageously, according to a non-limiting embodiment the calibration means further comprise third means for making the phase-locked loop oscillate far from a normal operation point so that said sinusoidal signal has a high amplitude compared to said normal operation point and which settles rapidly. The advantage of this is that a calibration phase can be started very rapidly.

These and other aspects of the invention are apparent from and will be elucidated, by way of non-limitative example, with reference to the embodiment(s) described hereinafter.

In the discussion that follows the functions of structures well known to the expert will not be described in detail because they would needlessly overburden the description.

The present description of the invention relates to an example of an integrated circuit used in the domain of mobile telephony and integrated notably in a receiver of a portable telephone, which is also called a mobile. The receiver and the components forming it operate at more or less different frequencies.

The various frequencies are generated by a phase-locked loop PLL integrated with the integrated circuit.

Figure 1:
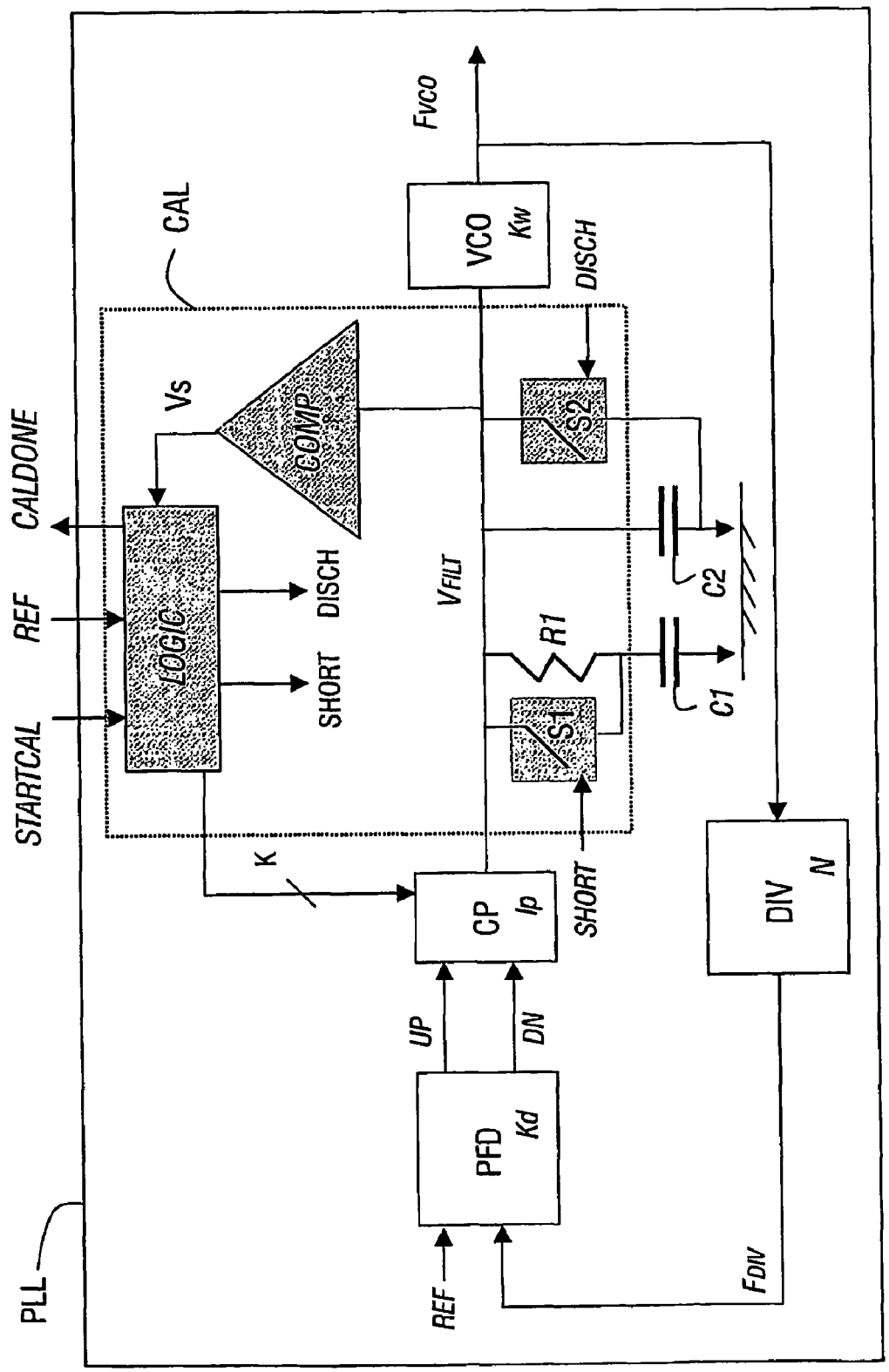
FIG. 1 illustrates in a diagrammatic way a first embodiment of the phase-locked loop comprising a second-order filter and associated calibration means according to the invention.

A first embodiment of such a loop is shown in FIG. 1. The loop PLL comprises:
  a voltage-controlled oscillator VCO having a gain Kw and intended to deliver an output frequency Fvco which is proportional to a filter voltage Vfilt, said output frequency Fvco corresponding to the frequency one wishes to obtain for a given application;
  a divider DIV for dividing by a factor N the output frequency Fvco of the voltage-controlled oscillator VCO and for thus generating a first input frequency Fdiv, the factor N currently being called division factor;
  a phase detector PFD having gain Kd and intended to measure the phase difference between a reference frequency Fref for a given application and the first frequency Fdiv of the divider DIV and for delivering two output voltages UP and DN which are proportional to the measured phase difference;

a charge pump CP intended to transform the voltage pulses into current pulses Ip; and a second-order low-pass filter (referred to as FILT in the following) formed by a resistor R1 and two capacitors C1 and C2 for suppressing high-frequency signals coming from the phase comparator PFD and the charge pump CP, and for generating a filter voltage Vfilt which is used for controlling the voltage-controlled oscillator VCO, so that the latter can produce a desired output frequency Fvco.

It will be noted that the reference frequency Fref is fixed and is derived from a Quartz representing an external clock CLK (not shown) in the integrated circuit.

In the operation mode when the PLL is stable, the reference frequency Fref and input frequency Fdiv are equal as are the phases of the corresponding signals, which means that Fvco=N*Fref. The factor N is constant, the output voltage pulses UP and DN are identical and of minimum size. The result is a zero current at the output of the charge pump CP and no further charge is added to or removed from the filter FILT. Consequently, this filter voltage Vfilt is constant, it is stabilized.

In this case, the phase-locked loop PLL has a transfer function defined hereinafter, the transfer function being calculated by means of an analysis of small signals which is well known to the expert.

$$\frac{\theta vco}{\theta ref} = \frac{Kd*Ip*Kw}{N*(C1+C2)*s^2} * \frac{1+R1C1s}{1+R1\frac{C1C2}{C1+C2}s} \qquad (1)$$

θvco represents the phase of the output voltage Fvco in the frequency domain, θref the phase of the first input signal Fref in the frequency domain, and s is the complex angular frequency.

It will be observed that the left-hand part of the transfer function represents the gain G of the PLL, whereas the right-hand part represents the filter FILT included in the PLL.

The right-hand part of the transfer function is constant near the complex angular frequency, if R1, C1 and C2 are constant. In the opposite case, a calibration is also effected on R1, C1 and C2 by an appropriate method. It may be seen that the transfer function thus defined depends on the components VCO, CP, DIV, C1, C2 . . . which form it, these components being subject to internal parameter variations Kw, Ip, N . . . which may render the whole of the transfer function unstable. These variations of parameters are due, for example, to the ambient temperature, to the manufacturing method used, to the interactions between components, to the application developed . . . . It will be noted that only the phase comparator PFD has a constant parameter Kd.

In order to operate properly, the phase-locked loop is to have a stable transfer function i.e. a substantially constant transfer function because parameters such as stability, settling time and bandwidth of the noise transfer function (noise bandwidth) depend directly on said transfer function of the loop PLL. It will be noted that the settling time of a loop PLL is the time the loop requires to change the frequency Fvco when the dividing factor N of its divider DIV changes. For that matter, the noise transfer function of a loop PLL is the noise frequency response of the loop PLL.

It is thus necessary to suppress the effects from variations of the various components and thus obtain the constant factor $$\frac{Ip*Kw}{N*C}$$

where C represents all the capacitors of the filter FILT of the PLL, here the two capacitors C1 and C2.

In order to stabilize the phase-locked loop PLL, calibration means CAL are used for calibrating the loop at a constant desired frequency, so that the gain G is constant. The fact is based on the fact that the gain G of the PLL is directly linked with an oscillation frequency Fn of said PLL when the resistance R1 is equal to 0, as can be seen in equation (2). Actually, if the value of the resistance R1 is equal to 0, the PLL starts oscillating at the oscillation frequency Fn, also called natural oscillation frequency, so that $$Fn = \frac{1}{2\pi}\sqrt{\frac{Kd*Ip*Kw}{N*(C1+C2)}} \qquad (2)$$

The resistance R1 is thus essential for the stability of the PLL.

In a calibration stage the PLL will be rendered unstable, will be made to oscillate and put to a predetermined constant oscillation frequency Fno by correcting the natural oscillation frequency Fn. The constant predetermined oscillation frequency Fno is the frequency one wishes to obtain as a function of the application developed, so that the PLL has optimal performance.

For this purpose the phase-locked loop PLL comprises said calibration means CAL and the latter means comprise, as shown in FIG. 1:

first means S1, SHORT for rendering the phase-locked loop PLL unstable, so that it produces a sinusoidal signal Vfilt; these first means S1, SHORT will permit to short-circuit the resistor R1 of the filter FILT;

second means COMP for generating a squared signal from the sinusoidal signal; and a logic circuit LOGIC for:
  determining the frequency Fs of the squared signal Vs;
  comparing said frequency with a desired frequency Fno; and
  controlling the charge pump CP with a view to correcting the frequency of the squared signal as a function of the desired frequency Fno.

Preferably, the calibration means CAL further comprise third means S2, DISCH to unbalance the phase-locked loop PLL beyond a normal operation point so that said sinusoidal signal Vfilt produced by the loop PLL has a high amplitude relative to said normal operation point and which settles rapidly.

Preferably, the second means COMP are a comparator, the first means S1, SHORT comprise a first analog switch S1 which has a resistance that is low relative to the resistance R1 associated to a first interrupt signal SHORT, and the third means S2, DISCH comprise a second analog switch S2 associated to a second interrupt signal DISCH.

According to a first non-limiting configuration of the calibration means CAL, the first switch S1 is connected in parallel to the resistor R1 of the filter FILT and the second switch S2 is connected in parallel to the second capacitor C2 of the filter FILT.

Thus, for calibrating the PLL the following stages are carried out:

In a first stage 1) the calibration is initialized.

In a first sub-stage 1*a*), a control system (not shown) of the circuit IC starts the calibration by means of a start signal STARTCAL. This signal is put in the high state, it is sent to the logic circuit LOGIC of the loop PLL. The calibration phase commences.

It will be noted that as long as said signal STARTCAL is in the low state, no calibration is started. It will also be noted that the integrated circuit IC operates on a rising or falling edge of the clock CLK which has the reference frequency Fref. Consequently, to be sure that the start signal STARTCAL will be taken into account by said external clock CLK, said signal STARTCAL is to be at least equal to an external clock period CLK In a second stage 2), the calibration is carried out in the following manner.

In a second sub-stage 2*a*) the loop PLL is rendered unstable. The logic circuit LOGIC sends the first interrupt signal SHORT to the first switch S1. This switch S1 closes, which renders the PLL unstable because said switch S1 short-circuits the resistor R1 (the first capacitor C1 is discharged in the internal switch resistor S1, the latter being smaller than the resistance R1 of the filter) and because of this the effect of stabilizer of said resistance R1 is canceled. Said switch S1 remains closed as long as the signal SHORT is transmitted.

In a second sub-stage 2*b*) the logic circuit LOGIC sends the second interrupt signal DISCH to the second switch S2. The latter is closed during the transmission of the corresponding interrupt signal DISCH, said signal being transmitted at the start of the calibration for a negligible duration compared to the total time taken off by the calibration phase. The effect of the closing of this second switch S2 is that the filter voltage Vfilt is discharged i.e. connected to ground or to the voltage Vdd.

During the re-opening of said second switch S2, the oscillations start far from its normal operating point, also called balance point, of the phase-locked loop PLL, the balance point being determined by the frequency of the integrated circuit predetermined as a function of the desired application or equivalently, by the filter voltage Vfilt in the operation mode. Consequently, said oscillations of the signal Vfilt rapidly have a high amplitude relative to the balance point.

It will be noted that the second switch S2 is closed during not much time. Actually, there is no need to keep it closed any longer or else the calibration phase would be needlessly lengthened.

Figure 2:
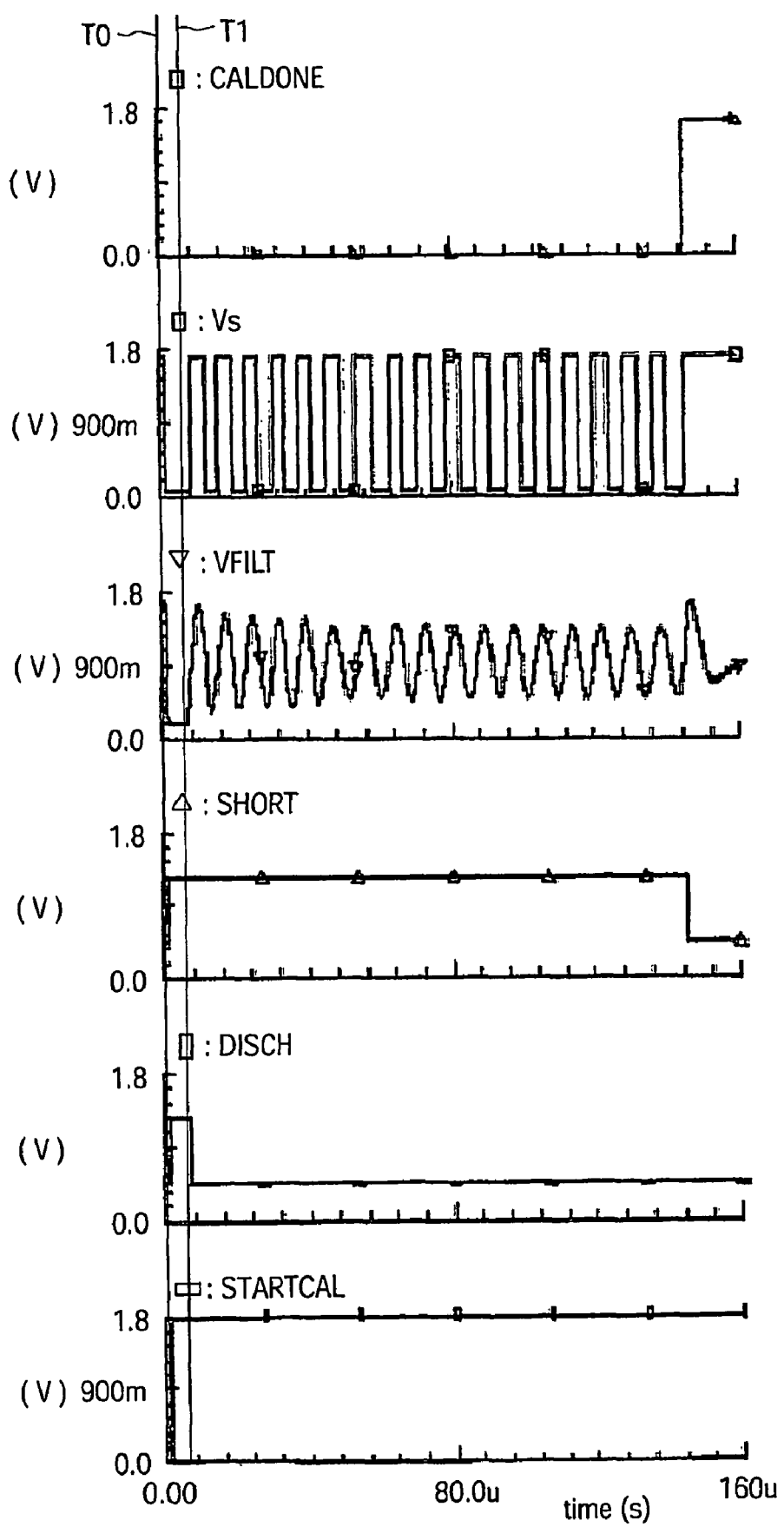
FIG. 2 illustrates digital signals managed by the phase-locked loop and by the calibration means of FIG. 1.

The capacitors of the filter FILT are discharged very rapidly. Thus, during the re-opening of the second switch S2, the loop PLL produces a sinusoidal signal Vfilt having a substantially elevated amplitude as is illustrated in FIG. 2. this amplitude very rapidly becomes constant and the oscillations are then stabilized.

It will be noted that the two sub-stages 2*a*) and 2*b*) may occur at the same time or one after the other. In the case where these two sub-stages occur sequentially, the second sub-stage 2*b*) is preferably effected before the first sub-stage 2*a*). Indeed, when the first switch S1 is closed, the loop PLL becomes unstable and oscillates, but close to its operation point Vfilt assumes the operation mode. The oscillation is thus slow and large amplitudes are obtained that have had to be waited for for a long time. On the other hand, if the second switch S2 is closed and opened beforehand, the PLL is out of balance far from its normal operation point and thus rapidly oscillates with a high amplitude relative to the normal operation point, of the order of a hundred mV. In that case very little time is waited for to commence the calibration. It will be noted that a small amplitude relative to the normal operation point is situated around ten mV.

It will further be noted that the first sub-stage 2*a*) is necessary because without it, if solely the second switch S2 is used, the loop PLL will come back to its normal balance point after a certain period of time.

In a third sub-stage 2*c*), the comparator COMP transforms the obtained sinusoidal signal Vfilt into a squared signal Vs which can be used by the logic circuit LOGIC. Thanks to the large amplitude of said sinusoidal signal Vfilt, the comparator COMP can easily be implemented and generate a readable squared signal Vs. Said squared signal Vs is then sent to the logic circuit LOGIC.

In a fourth sub-stage 2*d*) the logic circuit LOGIC measures the oscillation frequency Fs of the squared signal Vs, compares said frequency Fs with a desired constant frequency Fno and determines a current value Ip of the charge pump CP to be applied to the second-order filter FILT so that the PLL oscillates at the desired frequency Fno. This is preferably determined by means of the technique of successive approximations well known to the expert.

It will be noted that the value of the desired frequency Fno is chosen as a function of the nominal values of the components which form the phase-locked loop PLL, so that said PLL has optimal performance, the nominal values of the various components being known according to the manufacturing techniques used.

In order to set the PLL to a desired oscillation frequency Fno, it is necessary to have a reference time. The signal REF of the external clock CLK of known frequency Fref is taken as a reference time.

It will be noted that the frequency Fs of the squared signal Vs is equal to the natural oscillation frequency Fn of the PLL at a given time.

It will be noted that the frequency Fs of the squared signal Vs is lower than this input clock frequency Fref. Actually, for a PLL to be stable it is necessary that the reference frequency Fref is about 10 times higher than the natural oscillation frequency Fn and thus than the frequency Fs of the squared signal. Consequently, the number Nref of clock periods Tref in the clock signal REF is counted during a period of the squared signal Ts and this number Nref is compared with the desired number Napp=Fref/Fno of periods corresponding to the desired frequency Fno.

If the counted number Nref of clock periods Fref is lower than the desired number Napp, this is to say that the PLL oscillates at a natural oscillation frequency Fn that is higher than the desired one Fno. In this case the current Ip of the charge pump CP is to be reduced. In the opposite case, the current Ip is to be increased. It will be noted that the natural oscillation frequency Fn is proportional to the squared root of current Ip of the charge pump CP.

Obviously, the number of reference periods Tref can be counted over a higher number of periods of the squared signal Ts and thus of oscillations Tn of the PLL, which is more advantageous. Actually, in the case where the ratio between a period Ts of the squared signal and a reference period Tref will be equal to 10, and if the count is effected over five periods Ts of the squared signal, a 1/50 precision of difference calculation will be obtained, that is 2% in the case of a 1/10 precision, or 10% in the case where only one period Ts of the squared signal will be taken into account. In this way the counting precision is improved.

Preferably, the logic circuit LOGIC comprises successive approximative logic means known to the expert. These successive approximative logic means SAR (not shown) are based on a word S_MOT of K bits. With each reception of the result of the comparison by the logic circuit LOGIC, which is here the number of reference periods Nref, the successive approximative logic means SAR set one of the K bits of the word S_MOT to 1 or to 0. If the number of periods Nref is larger than the desired number of periods Napp, the oscillation frequency Fn of the loop is smaller than the desired value Fno; the associated current bit of the word S_MOT is set to 1 (so as to increase the current and, consequently, the oscillation frequency Fn and thus to come nearer to the desired value) and the next bit is set to 1; the current Ip is then increased by a weight associated to the current bit. In the opposite case, the associated current bit is set to 0 and the current is decreased by the weight associated to the current bit.

For K bits, the logic circuit needs only K iterations, one for each bit of the word S_MOT, the iterations corresponding here to K periods Ts of the squared signal Vs or also K oscillation periods Tn. Thus the approximative means SAR generate as a function of the number of calculated reference periods Nref a digital correction signal S_MOT which is the word of K bits, where K determines a number of steps that determine a correction resolution.

These approximative means SAR also permit to keep the K correction bits in the memory when the calibration phase is carried out Consequently, this permits the charge pump CP to utilize these K bits as input and derive a correction signal therefrom. Thus the word S_MOT of K bits is sent to the charge pump CP which transforms said word S_MOT into an analog signal which corrects the filter voltage Vfilt of the PLL. The correction is made progressively, because it is made as a function of the digital correction signal S_MOT which is produced cyclically at the charge pump CP until the frequency associated to the voltage Vfilt reaches the desired frequency Fno. This word S_MOT thus permits to determine a precise correction of the filter voltage Vfilt and thus of the associated natural oscillation frequency Fn. It will be noted that the charge pump CP transforms the word S_MOT into an analog correction current and delivers a corresponding correction voltage at the output.

Thus, the logic circuit LOGIC works with an algorithm that may be implemented in the following way.
1. setting the signals SHORT and DISCH to the high state and initializing the bits of the charge pump CP=100000 (S2 and S1 closed);
2. waiting for xxx microseconds (for the filter FILT to be discharged);
3. reset the signal DISCH (S2 open and S1 closed) to zero;
4. waiting for yyy microseconds for the PLL to oscillate in stable fashion (amplitude of the sinusoidal signal is high);
5. for n=K (number of bits of the SAR) up to 1:
   1. counting the number of periods Nref of the clock signal REF between the first rising edge of the squared signal Vs and the next rising edge (i.e. for 1 period Tn of the PLL);
   2. to the next rising edge, if Nref>Napp, then S_MOTbits[n]=1;
   3. S_MOTbits[n−1]=1;
6. setting the signal SHORT to zero (Si open);
7. waiting for zzz microseconds (for the PLL to be stabilized anew);
8. setting the end-of-calibration signal CALDONE to 1 (end of calibration, return to operation mode).

In a third stage 3), when the calibration i.e. the correction of the natural oscillation frequency Fn is terminated, all the bits of the word S_MOT have been used (they have been counted by means of an internal counter (not shown)), a stop signal CALDONE is sent by the logic circuit LOGIC to the control system of the integrated circuit IC. The calibration is then stopped. The first interrupt signal SHORT is no longer sent, it is set to the low state. The second switch S1 is thus re-opened and the integrated circuit IC comes back to the operation mode. For that matter, the comparator COMP is deactivated i.e. turned off. The comparator COMP thus does not have any current consumption when it is not used, which makes it possible to save on energy.

It will be noted that advantageously the calibration phase is carried out with each initialization or "power-on reset" of the receiver which contains the integrated circuit IC. This permits to re-initialize the word S_MOT which is deleted from the memory of the logic circuit SAR during a power-on reset.

Moreover, it will be noted that this calibration phase is repeated cyclically (cycle which may be programmed) preferably of the order of one minute each time the receiver is inactive i.e. does not communicate with a base station. These periods of non-communication are known in the receiver at a communication controller (not shown) of the mobile. This permits to be adapted over time and take the variations of the offset voltage of a circuit DEVICE into account, said voltage varying as a function of the evolution of the components of said circuit with time, as a function of temperature . . . .

Figure 3:
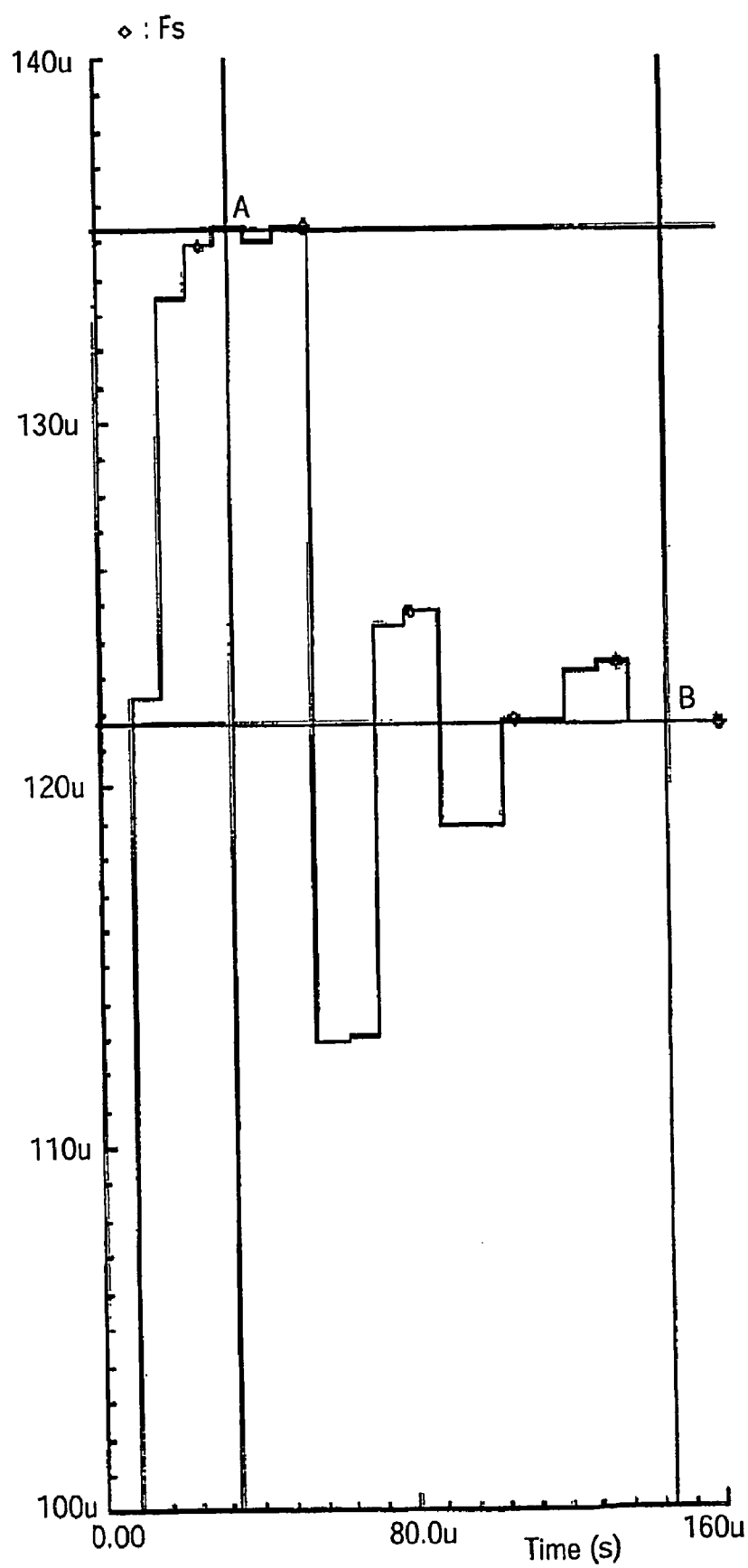
FIG. 3 is a diagram showing frequency variations at a filter of the phase-locked loop of FIG. 1.

An example of a calibration is illustrated in the FIGS. 2 and 3. In this example the PLL operates with a supply voltage of 1.8 V.

In FIG. 2, before time t0 i.e. before the calibration phase in the operation mode the input voltage Vfilt of the filter FILT is constant and is equal to 0.9 V in this example.

At time T0 the start signal STARTCAL for the calibration is activated by the integrated circuit IC and the signals SHORT and DISCH are emitted by the logic circuit LOGIC. The first switch S1 closes which renders the PLL unstable. The second switch S2 also closes, the filter voltage Vfilt is connected to ground until time T1 where the second interrupt signal DISCH is again set to the low state. The capacitors C1 and C2 are discharged in the second switch S2.

After several microseconds, 5 microseconds in this case, the second switch S2 opens. At the moment of its opening the PLL starts to oscillate and delivers a sinusoidal signal Vfilt whose amplitude is high compared to the constant 0.9 V, said signal oscillating between about 0.2 V and 1.5 V. As may be seen, the high amplitude settles rapidly. In the example shown, the maximum and minimum values of the filter voltage Vfilt are 0V and 1.8V respectively. The sinusoidal voltage becomes stable at the end of about 40 μs (whereas if the first switch S1 were closed first, one would have had a stable signal after 1 ms) and thus oscillates between 0.4 V and 1.4 V.

Subsequently, the comparator COMP is switched into service. It thus generates a squared signal Vs corresponding to the sinusoidal signal Vfilt. The squared signal Vs varies between the end values 0V and 1.8V. Said squared signal Vs is then sent in the logic circuit LOGIC which determines in successive steps by means of a word S_MOT the correction to be made to the frequency Fs of the squared signal Vs to arrive at the desired frequency Fno.

It will be noted again that the second interrupt signal DISCH has a negligible duration compared to the whole calibration phase i.e. several %, the time during which the filter FILT is discharged.

Each bit of the word S_MOT represents a weighting for the current Ip. In this example the word is formed by 6 bits. Thus, in this example the 6 bits have respective weights ½, ¼, ⅛, 1/16, 1/32, 1/64, the $6^{th}$ bit, which is the most significant bit MSB, having the largest weight ½. Before the start of the calibration the $6^{th}$ bit is set to 1 and all the other bits to 0. During a first oscillation period Tn1, the number of periods Nref of the squared signal Vs is lower than the desired number of periods Napp. The $6^{th}$ bit is set to 0, the $5^{th}$ bit is set to 1 and the current Ip of the charge pump CP is modified. The oscillation frequency Fn of the PLL changes as a function of the new value of the current of the charge pump CP and the comparator COMP leaves a squared signal Vs of corresponding frequency Fs.

During a second oscillation period Tn2, the number of periods Nref of the squared signal Vs is again lower than the desired number of periods Napp. The $5^{th}$ bit is set to 0, the $4^{th}$ bit is set to 1 and the current Ip of the charge pump CP is modified. The oscillation frequency Fn of the PLL changes as a function of the new value of the current of the charge pump CP. The comparator COMP leaves the new frequency Fs of the corresponding squared signal Vs . . . , and so on up to the sixth oscillation period Tn6 where all the 6 bits have been determined correctly and where the PLL oscillates at the desired frequency Fno.

The Table below is an example of the determination of 6 bits of the word S_MOT.

| Iteration | Nref-Napp | S_MOT | Bit | Weight | value |
|---|---|---|---|---|---|
| Start |  | 1 0 0 0 0 0 | 5 | ½ | 0 |
| 1 | <0 | 0 1 0 0 0 0 | 4 | ¼ | 0 |
| 2 | <0 | 0 0 1 0 0 0 | 3 | ⅛ | 1 |
| 3 | >0 | 0 0 1 1 0 0 | 2 | 1/16 | 0 |
| 4 | <0 | 0 0 1 0 1 0 | 1 | 1/32 | 1 |
| 5 | >0 | 0 0 1 0 1 1 | 0 | 1/64 | 0 |
| 6 | <0 | 0 0 1 0 1 0 |  |  |  |

It will be noted that the higher the number K of bits in the word S_MOT, the smaller the steps and consequently the more precise the calibration.

In FIG. 3 is shown the oscillation frequency Fn of the PLL plotted against time. In this example the following values have been considered. Fref=24 MHz, Nref=197, desired Fno=$24.10^6$/197=121.83 kHz. After stabilization of the oscillations (the signal DISCH is reset to 0) at point A, the calculation by successive approximations commences. It may be seen that after 150 µs, at point B, which corresponds to K iterations of the successive approximative logic means SAR, the oscillation frequency Fn of the PLL converges progressively to the desired frequency Fno to reach the value of 121.69 kHz.

When the calibration has ended, at time T2, the logic circuit LOGIC sets the signal SHORT to the low state and sends an end-of-calibration signal CALDONE to the control system of the integrated circuit IC. When this signal SHORT is reset to the low state, the first switch S1 is again opened and the resistor R1 of the filter again plays its role as stabilizer of the loop PLL. For that matter, the end-of-calibration signal tells the PLL that it can go back to the operation mode. However, it may be seen that the comparator COMP is no longer active and that the voltage of the filter Vfilt becomes stable again i.e. constant.

Figure 7:
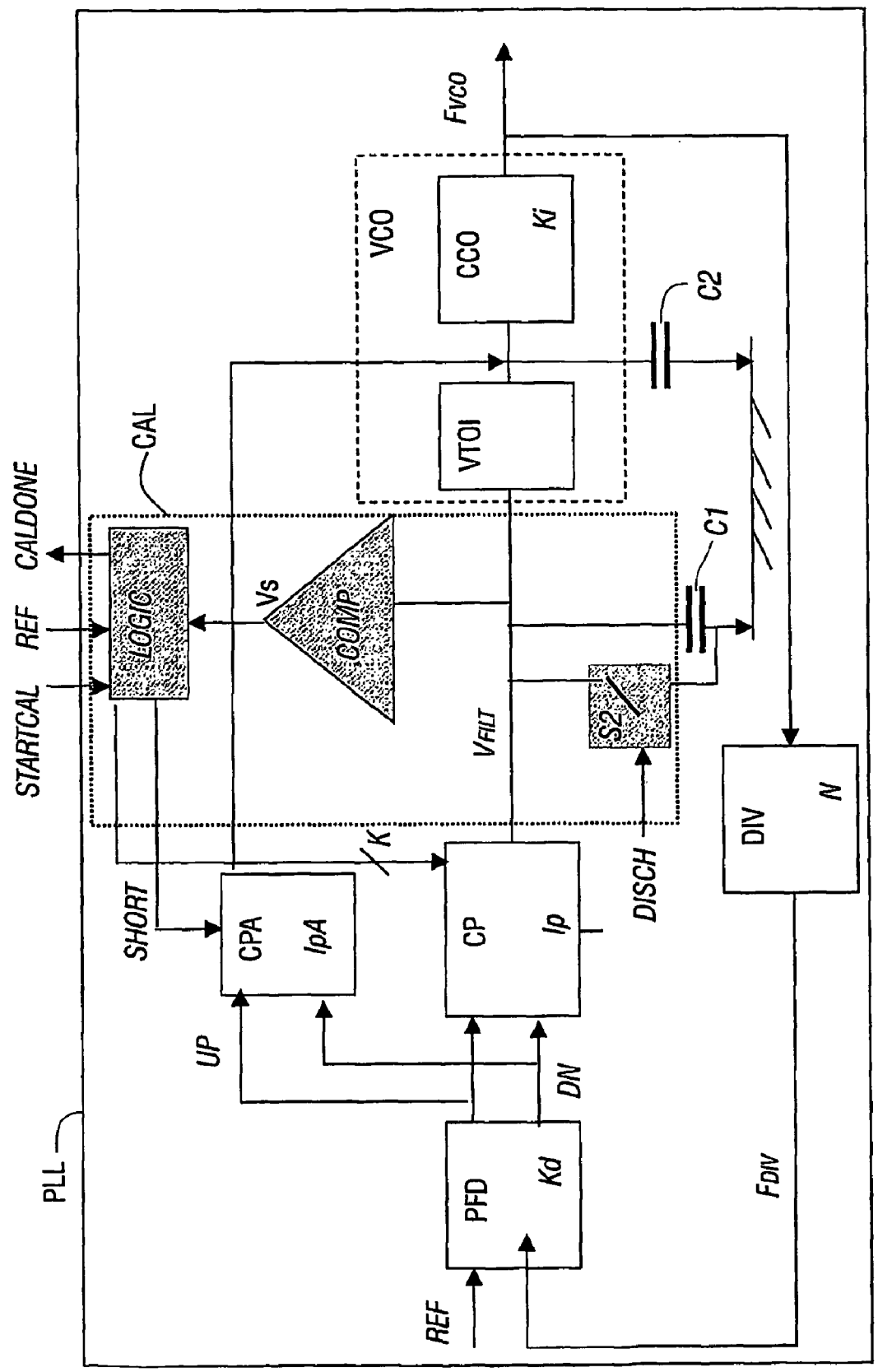
FIG. 7 illustrates a second embodiment of the phase-locked loop and of associated calibration means according to the invention.

According to a second embodiment of the phase-locked loop PLL, illustrated in FIG. 7, the PLL no longer comprises resistor R1 in its filter loop FILT. The resistor R1 is replaced by an additional charge pump CPA. For that matter, the voltage-controlled oscillator VCO of the phase-locked loop PLL comprises a voltage-to-current converter VTOI and a current-controlled oscillator CCO.

The additional charge pump CPA has the same stabilizing function as the resistor R1 of the first embodiment seen previously. To stabilize the loop PLL this additional charge pump CPA injects a current IpA directly at a node of the voltage-controlled oscillator VCO. The additional current IpA is sent to the connection point situated between the voltage-to-current converter VTOI and the current-controlled oscillator CCO, as can be seen in FIG. 7.

At this moment, to render the phase-locked loop PLL unstable, it is sufficient to cut off the current IpA from this additional charge pump CPA. For this purpose the logic circuit LOGIC sends the interrupt signal SHORT to the additional charge pump CPA. The latter comprises an internal current interrupt circuit (not shown) which interrupts the current IpA of said charge pump CPA when it receives the interrupt signal SHORT. The first means for rendering the phase-locked loop PLL unstable are thus here the interrupt signal SHORT and the internal current interrupt circuit of the additional charge pump CPA. In this case the second switch S2 is connected in parallel with the first capacitor C1 and the calibration means CAL no longer comprise the first switch S1.

Obviously, the scope of the invention is not solely limited to the embodiments described above and variations and modifications may be applied without, however, leaving the spirit and scope of the invention. Thus, as illustrated in FIG. 5, according to a second configuration of the calibration means CAL on a second-order filter, the first switch S1 is connected in series between the first capacitor C1 and the resistor R1.

Figure 4:
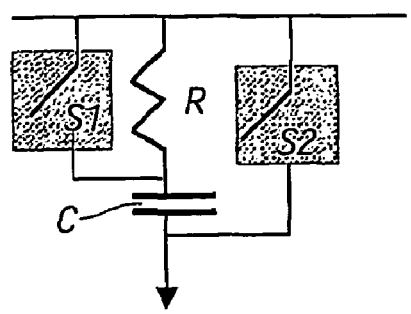
FIG. 4 illustrates a first configuration of calibration means of FIG. 1 applied to a first-order filter.
Figure 6:
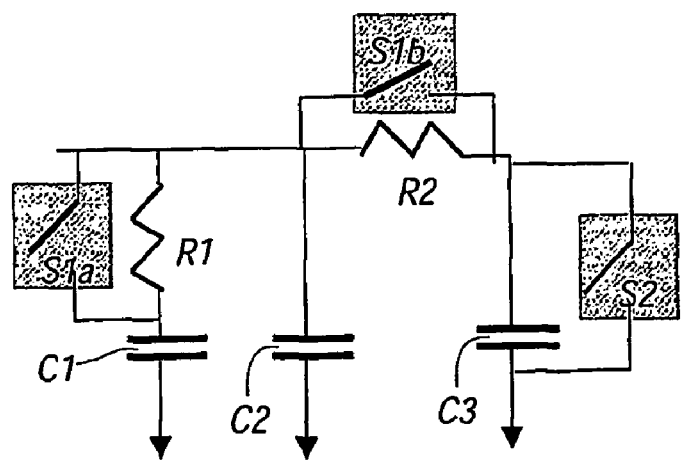
FIG. 6 illustrates a first and a second configuration of calibration means of FIG. 1 applied to a third-order filter.

In addition, it will be noted that the second-order filter comprised in the PLL is currently replaced by first-order filter represented in FIG. 4 or even the third-order filter represented in FIG. 6.

Thus, in FIG. 4 the first switch S1 is connected in parallel with the resistor R and the second switch S2 is connected in parallel with the capacitor C of the filter opposite to the first switch S1.

Figure 5:
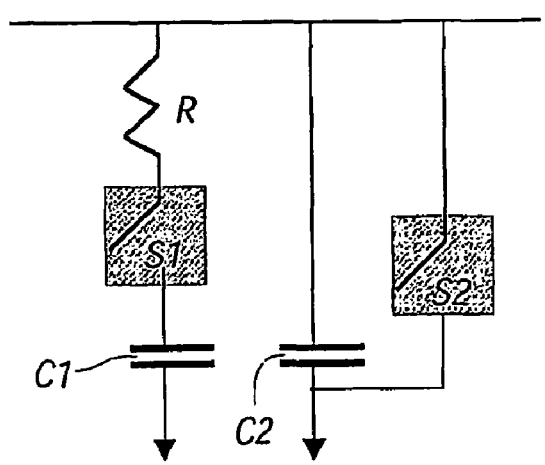
FIG. 5 illustrates a second configuration of the calibration means of FIG. 1 applied to a second-order filter.

In FIG. 5 may be seen that the second switch S2 is connected in parallel with the third capacitor C3, in the first switch S1 in parallel with the resistor R1 or in parallel with the second resistor R2.

It will be noted that in practice the integrated circuit comprising the loop PLL with 0.18 µm CMOS technology may be utilized. The switches S1 and S2 are then analog CMOS complementary switches and the comparator COMP is an NMOS pair followed by a differential conversion-to-single-output stage.

Thus, the invention offers a great number of advantages listed hereinafter.

First, the calibration method according to the invention is simple. It is not based on an exact measurement of the parameters of each component of the phase-locked loop and does not try to compensate for the variations of each component, which presents a certain difficulty.

In addition, this method, while reference is solely made to the external clock signal of the circuit which is constantly presented, does not require the presence of additional external reference current or voltage. Thus, on the one hand, it is avoided to create external circuits necessary for producing such current and voltage and, on the other hand, to utilize complicated calculations to make precise measurements of such current and voltage.

Secondly, the calibration means of the integrated circuit are easy to use because they utilize only simple analog elements such as the switches and the comparator which, in addition, are small and thus do not take up much place on the silicon of the integrated circuit.

Moreover, these calibration means do not have current consumption when they do not operate i.e. when the calibration phase is not active.

Finally, the calibration method is flexible and may easily be adapted to various configurations of filters and various operation frequencies as we have seen above.

Obviously, the invention is not only restricted to the domain of mobile telephony, it may be extended to other domains, notably to all those that utilize an integrated circuit for which a phase-locked loop is necessary, domains relating to telecommunications utilizing for example the Blue tooth standard or the communication protocol LAN, to imaging, to television . . . .

No reference sign in the present text is to be interpreted as limiting said text.

The verb "to comprise" and its conjugations must not be interpreted in limiting fashion i.e. not excluding the presence of not only other elements than those listed after said verb, but a plurality of elements already listed after said verb and preceded by the article "a" or "an".

Although, it was described an IC circuit, the invention concerns the case of any circuitry which may be not an integrated circuit.

The invention claimed is:

1. A circuit comprising: a phase-locked loop, the phase-locked loop comprising a charge pump and calibration means for the loop, wherein calibration means comprise:
   first means for rendering the phase-locked loop unstable so that a sinusoidal signal is provided at least internal to the phase-locked loop;
   second means for generating a squared signal from the so-provided sinusoidal signal; and
   a logic circuit for:
      determining the frequency of the squared signal; and
      controlling the charge pump with a view to correcting the frequency of the squared signal as a function of a desired frequency.

2. An integrated circuit (IC) comprising a phase-locked loop (PLL), a charge pump (CP) and calibration means (CAL) of the loop, characterized in that the calibration means (CAL) comprise:
   first means (S1, SHORT) for rendering the phase-locked loop (PLL) unstable so that it supplies a sinusoidal signal (Vfilt);
   second means (COMP) for generating a squared signal (Vs) from the sinusoidal signal (Vfilt); and
   a logic circuit (LOGIC) for:
      determining the frequency (FS) of the squared signal (Vs);
      comparing said frequency (FS) with a desired frequency (Fno); and
      controlling the charge pump (CP) with a view to correcting the frequency (Fs) of the squared signal as a function of the desired frequency (FNO); and
   third means (S2, DISCH) for making the phase-locked loop (PLL) oscillate far from a normal operation point, so that said sinusoidal signal (Vfilt) has a high amplitude compared to the normal operation point and which settles rapidly.

3. A circuit as claimed in claim 1, wherein the charge pump corrects the frequency of the squared signal in successive steps.

4. A method of calibrating a phase-locked loop comprising a charge pump, the method comprising:
   rendering the phase-locked loop unstable so that a sinusoidal signal is provided at least internal to the phase-locked loop;
   generating a squared signal from the so-provided sinusoidal signal;
   determining the frequency of the squared signal; and
   controlling the charge pump with a view to correcting the frequency of the squared signal as a function of a desired frequency.

5. A method of calibrating a phase-locked loop (PLL) comprised in an integrated circuit (IC) comprising a charge pump (CP), characterized in that it comprises the stages of:
   rendering the phase-locked loon (PLL) unstable so that it produces a sinusoidal signal;
   generating a squared signal (Vs) from the sinusoidal signal (Vfilt);
   determining the frequency (Fs) of the squared signal (Vs);
   comparing said frequency (Fs) with a desired frequency (Fno);
   controlling the charge pump (CP) with a view to correcting the frequency (Fs) of the squared signal as a function of the desired frequency (Fno): and,
   making the phase-locked loop (PLL) oscillate far from a normal operating point so that said sinusoidal signal (Vfilt) has a high amplitude compared to the normal operation point and which settles rapidly.

6. A method of calibrating a phase-locked loop as claimed in claim 4, wherein controlling the charge pump (CP) is provided in successive steps.

7. A receiver comprising an integrated circuit as claimed in claim 1.

8. A circuit comprising a phase-locked loop, the phase-locked loop comprising a charge pump and calibration means for the loop, wherein the calibration means comprise:
   first means for rendering the phase-locked loop unstable so that a sinusoidal signal is provided at least internal to the phase-locked loop;
   second means for generating a squared signal from the so-provided sinusoidal signal; and
   a logic circuit for:
      determining the frequency of the squared signal; and
      controlling the charge pump with a view to correcting the frequency of the squared signal as a function of a desired frequency.

9. A circuit as claimed in claim 8, wherein, toward controlling the charge pump, the logic circuit compares said frequency of the squared signal with the desired frequency.

10. A circuit as claimed in claim 1, wherein, toward controlling the charge pump, the logic circuit compares said frequency of the squared signal with the desired frequency.

11. A circuit as claimed in claim 1, wherein the phase-locked loop is provided in an integrated circuit.

12. A circuit as claimed in claim 1, wherein the phase-locked loop comprises plural components, at least two of said plural components being susceptible to calibration, and wherein calibration means enables calibration of the combination of said two plural components in calibrating the phase-locked loop.

13. A circuit as claimed in claim 1, wherein the phase-locked loop further comprises a stabilizing component, the stabilizing component functioning to stabilize the phase-locked loop in the operation mode of the phase-locked loop, and wherein said first means operates to impede the function of the stabilizing component in rendering the phase-locked loop unstable.

14. A circuit as claimed in claim 13, wherein the stabilizing component is a resistive component of a filter and said first means comprises a switch component, the switch component impeding by shorting the resistive component.

15. A circuit as claimed in claim 13, wherein the phase-locked loop further comprises a voltage-controlled oscillator, and wherein the stabilizing component is an additional charge pump, the additional charge pump being coupled to voltage-controlled oscillator, and wherein said first means impedes by interrupting the operation of the additional charge pump.

16. A circuit as claimed in claim 1, further comprising third means for making the phase-locked loop oscillate far from a normal operation point, so that said sinusoidal signal has a high amplitude compared to the normal operation point and which settles rapidly.

17. A circuit as claimed in claim 16, wherein the phase-locked loop further comprises a filter, the filter including a capacitive component, and wherein said third means comprises a switch component, the switch component operating to bypass the capacitive component.

18. A method as claimed in claim 4, further comprising comparing said frequency of the squared signal with the desired frequency toward controlling the charge pump.

19. A receiver as claimed in claim 7, wherein the receiver is housed in a mobile telephone.

20. A receiver as claimed in claim 7, wherein the receiver is a Bluetooth-compliant receiver.

* * * * *